US006812717B2

(12) United States Patent
Borden et al.

(10) Patent No.: US 6,812,717 B2
(45) Date of Patent: Nov. 2, 2004

(54) USE OF A COEFFICIENT OF A POWER CURVE TO EVALUATE A SEMICONDUCTOR WAFER

(75) Inventors: Peter G. Borden, San Mateo, CA (US); Regina G. Nijmeijer, Campbell, CA (US); Beverly J. Klemme, Palo Alto, CA (US)

(73) Assignee: Boxer Cross, Inc, Santa Clara, CA (US)

( * ) Notice: Subject to any disclaimer, the term of this patent is extended or adjusted under 35 U.S.C. 154(b) by 356 days.

(21) Appl. No.: 09/799,481

(22) Filed: Mar. 5, 2001

(65) Prior Publication Data

US 2002/0167326 A1 Nov. 14, 2002

(51) Int. Cl.$^7$ .......................... G01R 31/26; G01N 21/41
(52) U.S. Cl. .................. 324/752; 324/766; 356/432; 356/447
(58) Field of Search ................ 324/752, 501, 324/750, 765, 766, 767; 356/432, 433, 445, 447

(56) References Cited

U.S. PATENT DOCUMENTS

| | | | |
|---|---|---|---|
| 3,909,602 A | 9/1975 | Micka ........................... 716/4 |
| 3,930,730 A | 1/1976 | Laurens et al. ............. 356/106 |
| 4,358,201 A | 11/1982 | Makosch .................... 356/351 |
| 4,513,384 A | 4/1985 | Rosencwaig ................ 702/170 |
| 4,652,757 A | 3/1987 | Carver ...................... 250/360.1 |
| 4,795,260 A | 1/1989 | Schuur et al. ............. 356/400 |
| 4,996,659 A | 2/1991 | Yamaguchi et al. ........ 714/736 |
| 5,034,611 A | 7/1991 | Alpern ........................ 250/372 |
| 5,074,669 A | 12/1991 | Opsal .......................... 356/447 |
| 5,430,548 A | 7/1995 | Hirio et al. .................. 356/394 |
| 5,574,562 A | 11/1996 | Fishman et al. ............. 356/432 |
| 5,652,716 A | 7/1997 | Battersby ...................... 703/13 |
| 5,761,082 A | 6/1998 | Miura-Mattausch ......... 703/14 |
| 5,764,363 A | 6/1998 | Ooki et al. .................. 356/364 |
| 5,790,251 A | 8/1998 | Hagiwara .................... 356/351 |
| 5,877,860 A | 3/1999 | Borden ........................ 356/376 |
| 5,883,518 A | 3/1999 | Borden ........................ 324/752 |
| 6,054,868 A | 4/2000 | Borden et al. .............. 324/752 |
| 6,154,280 A | 11/2000 | Borden ........................ 356/376 |
| 6,483,594 B2 | 11/2002 | Borden et al. .............. 356/502 |
| 6,694,284 B1 | 2/2004 | Nikoonahad et al. ....... 702/155 |
| 6,734,968 B1 | 5/2004 | Wang et al. ................. 356/369 |

FOREIGN PATENT DOCUMENTS

WO            00/07357            3/2000

OTHER PUBLICATIONS

Constantinos Christofides "Photomodulated Thermoreflectance Investigation of Semiconducting Implanted Wafers," Microelectronic Engineering, 40 (month unavailable) (1998), 251–261.

(List continued on next page.)

Primary Examiner—Ernest Karlsen
(74) Attorney, Agent, or Firm—Silicon Valley Patent Group LLP

(57) ABSTRACT

A coefficient of a function that relates a measurement from a wafer to a parameter used in making the measurement (such as the power of a beam used in the measurement) is determined. The coefficient is used to evaluate the wafer (e.g. to accept or reject the wafer for further processing), and/or to control fabrication of another wafer. In one embodiment, the coefficient is used to control operation of a wafer processing unit (that may include, e.g. an ion implanter), or a heat treatment unit (such as a rapid thermal annealer).

34 Claims, 7 Drawing Sheets

OTHER PUBLICATIONS

W. L. Smith et al. "Ion Implant Monitoring With Thermal Wave Technology," Nuclear Instruments and Methods Physics Research, B21, (month unavailable) (1987), 537–541.

S. Wurm et al. "Modulated Optical Reflectance Measurements on Amorphous Silicon Layers and Detection of Residual Defects" Applied Physics A 47, 147–155, Springer–Verlag, Oct., 1988.

S. Prussin and Chirstiaan A. Bil, "Role of Annealing Time on Junction Depth for High Dose Phosphorus Implants," Proceed. 1998 International Conference on Ion Implantation Technology, vol. 2 (month unavailable) 1999.

C. B. Yarling et al. "Investigation of Rapid Thermal Process–Induced Defects in Ion–implanted Czochralski Silicon," pp. 192–199, SPIE vol. 1393, Rapid Thermal and Related Processing Techniques, (month unavailable) 1990.

J. Opsal, "High Resolution Thermal Wave Measurements and Imaging of Defects and Damage in Electronic Materials" Photoacoustic and Photothermal Phenomena II, Springer Series in Optical Sciences, vol. 62, Springer Verlag Berlin, Heidelberg, (month unavailable) 1990.

Jon Opsal, "Modulated Interference Effects and Thermal Wave Monitoring of High–Dose Ion Implantation in Semiconductors," Review of Progress in Quantitative Nondestructive Evaluation, vol. 8B, Plenum Publishing Corporation, (month unavailable) 1989.

S. Hahn et al. "Damage and RTA Kinetics in $AR^+$ and $SI^+$ Ion Implanted CZ Silicon Characterized by Thermal Wave Modulated Optical Reflectance," pp. 120–129 of SPIE vol. 1595, Rapid Thermal and Integrated Processing (month unavailable) (1991).

T. Hara et al. "Damage Formed By Ion Implantation In Silicon Evaluated By Rutherford Backscattering, Reflected High Energy Electron Diffraction and Thermal Wave Modulated Optical Reflectance," Defect Control in Semiconductors, Elsevier Science Publishers, (month unavailable) 1990.

USE OF A COEFFICIENT OF A POWER CURVE TO EVALUATE A SEMICONDUCTOR WAFER

CROSS-REFERENCES TO RELATED APPLICATIONS

This application is related to and incorporates by reference herein in its entirety, the commonly owned, copending U.S. patent application Ser. No. 09/544,280, filed Apr. 6, 2000, entitled "Apparatus And Method For Evaluating A Semiconductor Wafer" by Peter G. Borden et al., which is a continuation of Ser. No. 09/095804, filed Jun. 10, 1998 now issued as U.S. Pat. No. 6,049,220.

This application is also related to and incorporates by reference herein in its entirety the commonly owned, copending U.S. patent application, Ser. No. 09/274,821, filed Mar. 22, 1999, entitled "Apparatus And Method For Determing The Active Dopant Profile In A Semiconductor Wafer," by Peter G. Borden et al.

BACKGROUND OF THE INVENTION

In the processing of a semiconductor wafer to form integrated circuits, charged atoms or molecules are directly introduced into the wafer in a process called ion implantation. Ion implantation normally causes damage to the lattice structure of the wafer, and to remove the damage, the wafer is normally annealed at an elevated temperature, typically 600° C. to 1100° C. Prior to annealing, material properties at the surface of the wafer may be measured, specifically by using the damage caused by ion implantation.

For example, U.S. Pat. No. 4,579,463 granted to Rosencwaig et al. (that is incorporated herein by reference in its entirety) describes a method for measuring a change in reflectance caused by a periodic change in temperature of a wafer's surface (see column 1, lines 7–16). Specifically, the method uses "thermal waves [that] are created by generating a periodic localized heating at a spot on the surface of a sample" (column 3, lines 54–56) with "a radiation probe beam . . . directed on a portion of the periodically heated area on the sample surface," and the method "measures] the intensity variations of the reflected radiation probe beam resulting from the periodic heating" (column 3, lines 52–66).

As another example, U.S. Pat. No. 4,854,710 to Opsal et al. (also incorporated herein by reference in its entirety) describes a method wherein "the density variations of a diffusing electron-hole plasma are monitored to yield information about features in a semiconductor" (column 1, lines 61–63). Specifically, Opsal et al. state that "changes in the index of refraction, due to the variations in plasma density, can be detected by reflecting a probe beam off the surface of the sample within the area which has been excited" (column 2, lines 23–31) as described in "Picosecond Ellipsometry of Transient Electron-Hole Plasmas in Germanium," by D. H. Auston et al., Physical Review Letters, Vol. 32, No. 20, May 20, 1974.

Opsal et al. further state (in column 5, lines 25–31 of U.S. Pat. No. 4,854,710): "The radiation probe will undergo changes in both intensity and phase. In the preferred embodiment, the changes in intensity, caused by changes in reflectivity of the sample, are monitored using a photodetector. It is possible to detect changes in phase through interferometric techniques or by monitoring the periodic angular deflections of the probe beam."

A brochure entitled "TP-500: The next generation ion implant monitor" dated April, 1996 published by Therma-Wave, Inc., 1250 Reliance Way, Fremont, Calif. 94539, describes a measurement device TP-500 that requires "no post-implant processing" (column 1, lines 6–7, page 2) and that "measures lattice damage" (column 2, line 32, page 2). The TP-500 includes "[t]wo low-power lasers [that] provide a modulated reflectance signal that measures the subsurface damage to the silicon lattice created by implantation. As the dose increases, so does the damage and the strength of the TW signal. This non-contact technique has no harmful effect on production wafers" (columns 1 and 2 on page 2). According to the brochure, TP-500 can also be used after annealing, specifically to "optimize . . . system for annealing uniformity and assure good repeatability" (see bottom of column 2, on page 4).

U.S. Pat. No. 5,978,074 discloses focusing a probe beam onto a sample surface withn an area periodically excited by an intensity modulated generation beam. The power of the reflected probe beam is measured by a photodetector, and the modulated optical reflectivity of the sample is derived. Measurements are taken at a plurality of pump beam modulation frequencies. In addition, measurements are taken as the lateral separation between the pump and probe beam spots on the sample surface is varied.

At column 3, lines 23–30, U.S. Pat. No. 5,978,074 states that "in the prior art, the modulation range was typically in the 100 KHz to 1 MHz range. Some experiments utilized modulation frequency as high as 10 MHz. In the subject device, it has been found useful to take measurements with modulation frequencies up to 100 MHz range. At these high frequencies, the thermal wavelengths are very short, enabling information to be obtained for thin metal layers on a sample, on the order of 100 angstroms."

At column 8, lines 22–27, U.S. Pat. No. 5,978,074 further states "Once all measurements at various spacings and modulation frequencies have been taken and stored, the processor will attempt to characterize the sample. Various types of modeling algorithms can ve used depending on the complexity of the sample. Optimization routines which use iterative processes such as least square fitting routines are typically employed."

Abruptness of a junction in a semiconductor wafer can be measured by Secondary Ion Mass Spectrometry (SIMS) in which a wafer is milled away using an ion beam, and the removed material is analyzed. Alternatively, abruptness of a junction can also be determined from electrical characteristics of transistors or other test structures on a completely fabricated integrated circuit (IC) device, having contacts.

SUMMARY

An apparatus and method in accordance with the invention use a computer to determine a coefficient in a function that relates measurements from a wafer, to values of a parameter used in making the measurements, and use the coefficient to evaluate the wafer (e.g. to accept or reject the wafer for further processing), and/or to control fabrication of another wafer. For example, the apparatus and method may use a second order coefficient of a power series function to control operation of a wafer processing unit (that may include, e.g. an ion implanter), or a heat treatment unit (such as a rapid thermal annealer).

In one embodiment, two beams are used to make measurements that are input to the computer: one beam (called "generation beam") of photons having an intensity modulated at a frequency sufficiently low to avoid creation of a wave of charge carriers in the wafer, and another beam (called "probe beam") used to measure the concentration of charge carriers created by the generation beam. Specifically, a photosensitive element located in a path of a portion of the probe beam that is reflected by the charge carriers (and that is therefore also modulated) generates an electrical signal indicative of the concentration. Such measurements are related by the above-described function to the above-described parameter (which may be, for example, power of the generation beam, power of the probe beam, or spot size).

DETAILED DESCRIPTION

Figure 1A:
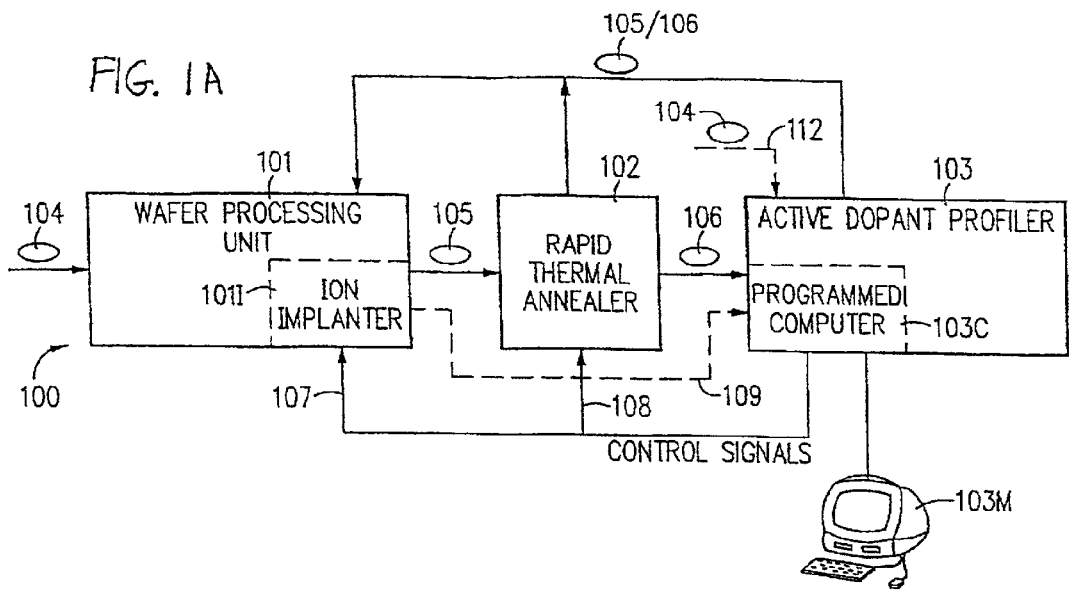
FIG. 1A illustrates, in a high level block diagram, a system including an apparatus (called "active dopant profiler") in accordance with the invention.

In accordance with the invention, an apparatus and method measure (in a first act) intensity of a beam reflected by charge carriers in the semiconductor material, change (in a second act) a parameter that affects the charge carriers, and repeat the measuring act 1, to obtain a number of measurements for a corresponding number of values of the parameter. Thereafter, the apparatus and method determine (in a third act) a coefficient of a function (such as a power series) that relates the measurements to the parameter values. Depending on the embodiment, the coefficient being determined can be of any order, such as second order (i.e. of a quadratic term), first order (i.e. of a linear term), and/or zeroth order (i.e. a constant).

In one embodiment, a second order coefficient is used as an indicator of abruptness of a junction in the wafer, and is used to control formation of the junction in another wafer and/or to accept/reject the just-fabricated wafer. In other embodiments, the zeroth order and/or the first order coefficients are used to control annealing of another wafer. The first order coefficient is indicative of the junction depth, which depends on the annealing temperature. The annealing temperature can affect the abruptness, and, hence, the second order coefficient as well.

In one implementation, the apparatus and method use two beams, a first beam to create charge carriers, and a second beam to measure reflectivity due (at least in part) to the charge carriers. The charge carriers (also called "excess carriers") being created by the first beam are in excess of a number of charge carriers (also called "background carriers") that are normally present in the wafer in the absence of illumination. In this embodiment, additional charge carriers (also called "measurement-related carriers") due to incidence of the second beam (also called "probe beam") are minimized or avoided, although in other embodiments such measurement related carriers are also used (e.g. to bias the junction, and a signal is measured, for different powers of probe beam).

Depending on the implementation, intensity of the first beam (also called "generation beam") can be modulated, at a frequency sufficiently low to avoid creation of a wave of charge carriers in the wafer when the first beam is incident on the wafer. Depending on the energy carried by such a wave, the wave perturbs the carrier distribution and diminishes the physical effect that makes the measurements (in the first act described above) a function of the parameter being changed (in the second act also described above.), e.g. makes charge carrier reflectance v/s power of generation beam a function of depth and abruptness. The modulation of the first beam is used primarily to detect very small signal using a lock-in amplifier.

Also, if both beams are laser beams, photons of the first beam and of the second beam may be respectively selected to have energy greater than and less than the bandgap energy of semiconductor material in the wafer. When two beams are used, centers of the two beams may be separated from (e.g. by 1 micron or more) or coincident with one another, depending on the embodiment. When the beams are separated from one another, the distance of separation can be either fixed, or variable, also depending on the embodiment, as long as the effect of a wave of charge carriers is minimized or eliminated from the measurements used as described herein to evaluate a semiconductor wafer.

Also, the beams may have spots that overlap or spots that are completely separated from one another, again depending on the embodiment. Instead of using the just-described first beam, any other mechanism well known in the art may be used to change the number of charge carriers that reflect the second beam. Also depending on the embodiment, measurements of the type described herein can be done with or without variation of the distance between the two beams. As noted elsewhere herein, measurements of one embodiment are made with the distance between two beams kept fixed for all measurements.

The apparatus and method of one implementation use a photosensitive element located in a path of a portion of the second beam reflected by the charge carriers, to generate an electrical signal related to reflectivity due to the charge carriers.

Depending on the implementation, the photosensitive element may be located directly in such a path, or may be part of an interferometer that is located in such a path. The interferometer may be used to measure interference between a portion of the second beam reflected, by charge carriers in the wafer, and one of: (1) another portion of the second beam that is reflected by the front surface of the wafer, or (2) a reference beam that has a time-varying phase but is coherent with the second beam reflection from the charge carriers.

In another implementation, the apparatus and method interfere a reflected portion of the second beam with an un-reflected portion of the second beam to obtain a sum component and a difference component, and determine a difference between the sum component and the difference component. In yet another implementation, the apparatus and method interfere a reference beam with the second beam portion reflected by the charge carriers and also interfere the reference beam with the second beam portion reflected by the wafer's front surface, and measure the phase difference between the two interference signals.

Between measurements, the apparatus and method of one implementation change the average number of charge carriers, so that the corresponding electrical signal being measured also changes. A computer coupled to the photosensitive element (either directly or indirectly e.g. through a lock-in amplifier and/or through an interferometer), is programmed to determine one or more coefficients (such as the second order coefficient) of a power series function that relates the electrical signal to the measurement.

In the above-described implementation, the computer relates changes in the intensity (also called "power") of the first beam to corresponding changes in the electrical signal, and the resulting function is referred to as a "power curve." The computer is programmed to determine the curvature of such a power curve, and use the curvature to extract measured values of physical parameters such as junction abruptness, and to accept/reject the current wafer, and/or to control fabrication of another wafer. Depending on the implementation, the computer may be optionally programmed to normalize the measurements prior to determining the curvature of the power curve, e.g. so that sensitivity to other parameters is reduced. Normalization may be used to eliminate sensitivity to, e.g. reflectivity of the surface of the semiconductor, although in another embodiment there is no normalization.

The computer may include a memory having encoded therein corresponding values of the coefficient that have been determined from wafers having known properties. If so, the computer uses the stored values to identify one or more properties of the wafer being tested (e.g. uses the second order coefficient to look up abruptness). Alternatively, the computer memory may have encoded therein one or more limits that are compared with the value of the coefficient for the wafer being tested, to determine a change (if any) that is to be made in operation of the heat treatment unit or the ion implantation unit (or both) so that the corresponding coefficient for a to-be-fabricated wafer falls within the limits.

A wafer fabrication system 100 (FIG. 1A) in one embodiment creates integrated circuit (abbreviated as "IC") dice by processing a wafer to form a "patterned wafer", measuring a material property of the patterned wafer, and adjusting the processing in real time if necessary, to obtain improved properties in a wafer fabricated next (or in a subsequently fabricated wafer, depending on the speed of measurement). The just-described processing can include annealing, and the measurement of a material property can be performed on a patterned wafer after annealing, thereby to determine process conditions not obtainable by prior art methods, e.g. to determine anneal temperature from measurements on the annealed wafer.

Measurement on patterned wafers during fabrication as described herein eliminates test wafers that may be otherwise required in the prior art solely to monitor the fabrication process, thus reducing costs. Moreover, measurements on annealed wafers as described herein provide a measure of one or more properties that are related to the electrical characteristics (such as processing speed) of the devices being fabricated, because annealing results in activation of the dopants used in the devices.

Figure 1B:
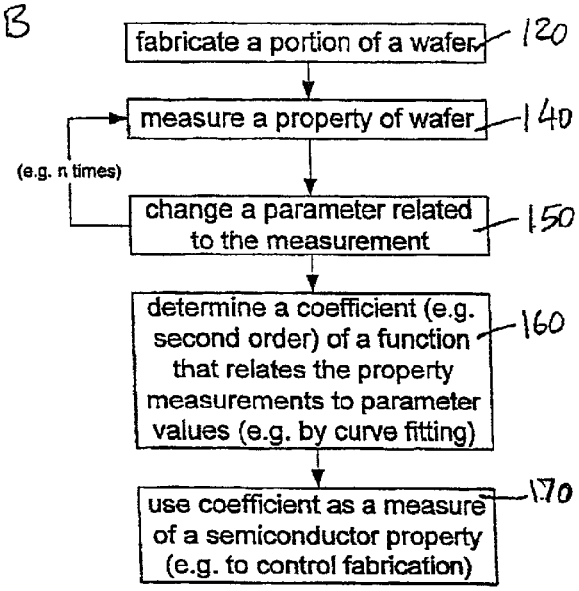
FIG. 1B illustrates, in a flow chart, acts performed by the system of FIG. 1A.

A wafer 104 is processed by a system 100 that includes a wafer processing unit 101 and an annealer 102 used to fabricate (see operation 120 in FIG. 1B) a portion thereof. A wafer in any stage of fabrication, such as one of wafers 104, 105 and 106 may be evaluated by a measurement device (hereinafter "active dopant profiler" or "profiler") 103 (FIG. 1A). Therefore, in the following description, the notation "104/105/106" is used to indicate that the description is equally applicable to each of wafers 104, 105 and 106. Similarly the notation "105/106" indicates each of wafers 105 and 106.

Specifically, a profiler 103 in accordance with the invention measures (see operation 140 in FIG. 1A) a property of wafer 104/105/106, changes (see act 150) a parameter related to charge carriers, and repeats the measurement act. Operation 140 and act 150 may be repeated n times (e.g. 10 times) to obtain a corresponding number of measurements. Next, in act 160, a programmed computer 103C in profiler 103 determines a coefficient of a function that relates the measurements to the values of the parameter, e.g. by curve fitting. In one embodiment, computer 103C determines the second order coefficient (i.e. also called "curvature") of a power series function, although in other embodiments, other coefficients of such a function or of other functions are determined.

Next, in act 170, computer 103C uses the just-described coefficient as a measure of a semiconductor property of wafer 104/105/106. For example, computer 103C uses the second order coefficient as a measure of the abruptness of a junction in the wafer 104/105/106. In other examples, computer 103C uses the first order coefficient (also called "slope") and/or the zeroth order coefficient (also called "constant") of the function as a measure of anneal temperature and/or junction depth.

Measuring junction abruptness as described above is non-destructive, and can be used on patterned wafers immediately after junction formation. In addition, such a measurement takes just a few seconds, and provides the throughput required for process control applications. Moreover, the method provides an unexpected result, considering that at least one prior art reference, namely U.S. Pat. No. 4,854,710 granted to Opsal teaches that depth information cannot be obtained in the absence of a plasma wave (specifically, Opsal states in column 4, lines 33–35, "[h]owever, in applications where sample variations as a function of depth need to be studied, it is necessary to generate and study plasma waves").

In one embodiment, system 100 performs an operation 120 (FIG. 1A) e.g. by operating an ion implanter 101I to create (as illustrated by act 121 of FIG. 2A), in a wafer 104 (FIG. 1A), one or more regions that have dopant atoms (e.g. boron atoms in silicon). Instead of ion implantation, any other process for creating doped regions, e.g. chemical vapor deposition, epitaxial deposition, evaporation, diffusion, or plasma deposition can be used in unit 101 (FIG. 1A) to perform act 120. Such regions may have a junction that is, for example less than 100 nm thick, and may even be less than 50 nm thick.

Thereafter, a patterned wafer 105 having one or more patterns of doped regions is transferred to a rapid thermal annealer 102 (FIG. 1A) that may be included in system 100. Rapid thermal annealer (also called "annealer") 102 performs an annealing act 122 (FIG. 2A), e.g. by heating wafer 105 (FIG. 1A) to a predetermined temperature (also called "annealing temperature"), e.g. to remove damage that is normally caused by ion implanter 101 to the lattice structure of the semiconductor material in the doped regions of wafer 105. Instead of a rapid thermal annealer, a furnace may be included in system 100 and used to anneal wafer 105 in act 122 (FIG. 2A).

Annealing in act 122 causes the dopant atoms (also called "dopants") to move into the lattice of the semiconductor material in a doped region, where the dopants act as donors (forming n-type material) or acceptors (forming p-type material). The extent to which the dopants incorporate into the lattice structure during act 122 is a function of the temperature at which and the time for which act 122 is performed. The incorporation is more complete at a higher temperature or after a longer time.

However, the dopants also diffuse (i.e. move) during act 122, thereby increasing the junction depth. The diffusion proceeds more rapidly at a higher temperature, and it is necessary to carefully control the annealing temperature. Therefore, abruptness of the junction is measured after act 122 (wherein wafer 104/105/106 is positioned within profiler 103), and the abruptness is compared with predetermined information (e.g. a specified limit or abruptness of wafers known to be good) to determine a change (if any) to be made to the annealing process and/or ion implantation process. Dynamic feedback of such to-be-made changes to the fabrication operation in real time as described herein improves the yield of good wafers obtained from fabrication in a manner not otherwise possible in the prior art.

Figure 2A:
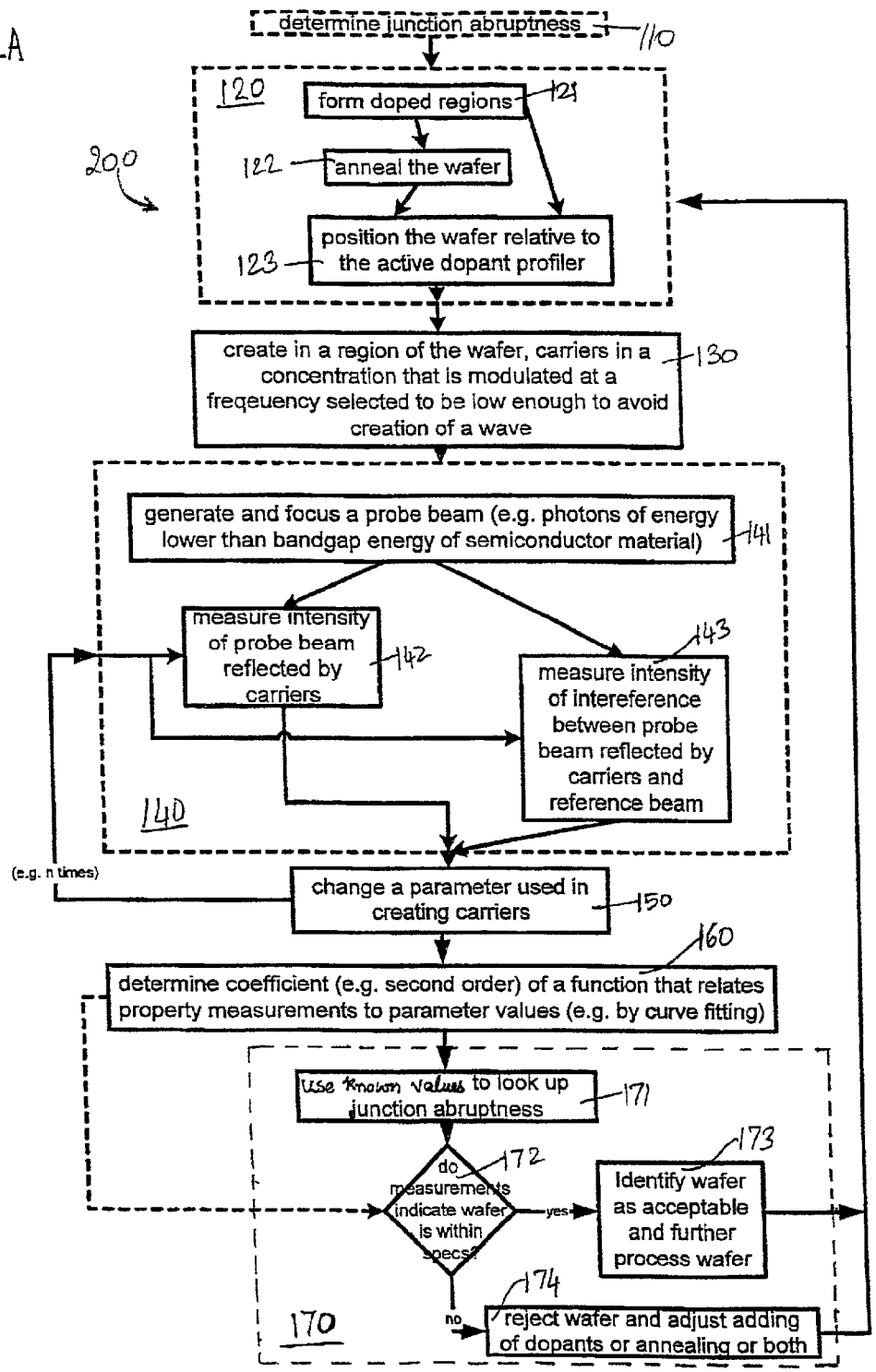
FIG. 2A illustrates, in a flowchart, the acts performed by the system of FIG. 1A in one implementation.

In one embodiment, an annealed wafer 106 (FIG. 1A) is transferred from rapid thermal annealer 102 to profiler 103, and positioned therein (see act 123 in FIG. 2A). In an alternative embodiment, an active dopant profiler is integrated into a rapid thermal annealer and does not require positioning after completion of anneal. In one embodiment, profiler 103 is moved relative to wafer 106 instead of moving wafer 106.

As noted above, a non-annealed wafer 105 can also be used (moved via path 109 in FIG. 1A) e.g. if dopant regions do not require annealing due to use of a method other than ion implantation, such as diffusion (wherein dopants are diffused into wafer 105 thermally, and are active, and there is no need to anneal out implant damage, or where dopant atoms are grown into the semiconductor through a process such as chemical vapor deposition (CVD)). Profiler 103 evaluates the efficacy of the dopants in a non-annealed wafer 105 in a manner similar to that described above for annealed wafer 106. A starting wafer 104 can also be used as illustrated by a path 112 in FIG. 1A.

Next, after a wafer 104/105/106 is properly positioned, profiler 103 creates (see act 130 in FIG. 2A) in a region of the wafer, a number of excess charge carriers that are modulated at a predetermined frequency. The predetermined frequency is selected to ensure that a wave of the charge carriers is not created during the measurement (see operation 140 in FIG. 2A). As profiler 103 does not use a "plasma wave" as described in U.S. Pat. No. 4,854,710, profiler 103 is as effective in measuring a property of an annealed wafer 106 as in measuring a property of a non-annealed wafer 104/105.

Figure 2B:
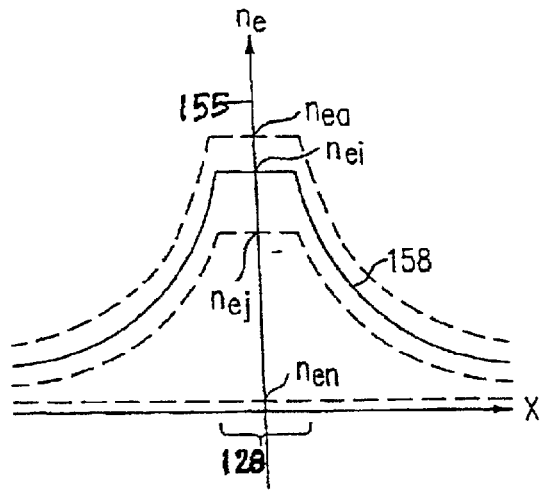
FIG. 2B illustrates, in a graph, the temporal modulation of charge carriers by the active dopant profiler of FIG. 1A, without creation of a wave, in a critical aspect of one embodiment.

Prior to measuring a material property in operation 140, profiler 103 creates (see act 130 in FIG. 2A), in a region 128 (FIG. 2B) of wafer 104/105/106, a concentration $n_e$ of excess carriers, and modulates concentration $n_e$ (i.e. increases and decreases) as a function of time t but not as a function of distance x, e.g. from a central axis 155 (FIG. 2B) of region 128. Specifically, over a time period that is the inverse of the modulation frequency, profiler 103 changes concentration $n_e$ between the values $n_{ea}-n_{en}$, wherein $n_{en} \leq n_{ej} \leq n_{ei} \leq n_{ea}$ (FIG. 2B). Therefore, at any given time ti, the value $n_{ei}$ of the carrier concentration decays as a function of the distance x, without the creation of a wave in space. Profiler 103 of one embodiment ensures that there is no periodicity in space of the value of concentration $n_e$. Instead, concentration ne simply decays radially (e.g. roughly exponentially as a function of radial distance) outside region 128, as illustrated in FIG. 2B.

To ensure the absence of a wave in space, the frequency of modulation of carrier concentration C is selected to be several times (e.g. one or more orders of magnitude) smaller than the modulation frequencies used in the prior art to generate waves as described in, for example, U.S. Pat. No. 4,854,710. Specifically, in one implementation of this invention, the modulation frequency is approximately 1 KHz that is one thousand times (three orders of magnitude) smaller than a 1 MHz frequency described in column 15, line 18 of U.S. Pat. No. 4,854,710 by Opsal. Use of such a low modulation frequency is a critical aspect in one embodiment, and leads to unexpected results due to the elimination of a wave in space, such as the "wave" described by Opsal. In another embodiment, the modulation frequency is any frequency lower than 1000 Khz (e.g. 900 Khz) and profiler 103 still provides a measure of a material property as described herein.

Figure 2C:
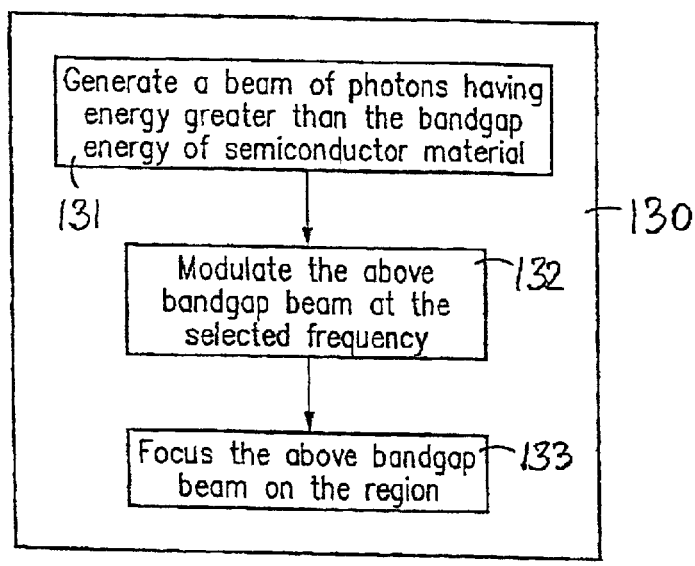
FIG. 2C illustrates, in a flowchart, creation of charge carriers by use of a generation beam.

In one embodiment, profiler 103 implements the above-described act 130 (FIG. 2A) by: generating (act 131 in FIG. 2C) a beam 151 (FIG. 2D) of photons that have energy greater than the bandgap energy of the semiconductor material in doped region 138 (FIG. 2D), modulating (act 132 in FIG. 2C) beam 151 at a frequency selected to avoid the creation of a wave (as described above), and focusing (act 133 in FIG. 2C) beam 151 on doped region 138. Depending on the implementation, beam 151 can have a spot size (diameter at the wafer's surface) of about 2 microns.

Depending on the implementation, profiler 103 modulates the intensity of generation beam 151 at any frequency in the range of 1 Hz to 20,000 Hz, as described in U.S. patent application Ser. No. 09/544,280 incorporated by reference above. The modulation frequency can be, for example, 1000 Hz, and may require at least 10 cycles for a lock-in amplifier to generate a reflectance measurement (based on a probe beam as described below in reference to acts 142 and/or 143 of FIG. 2A), or 10 milliseconds to perform each reflectance measurement.

Note that frequencies greater than 20,000 Hz can be used, as long as the effects of a wave are minimized or eliminated (e.g. by use of multiple modulation frequencies followed by filtering to eliminate the effect of a change in frequency).

Moreover, frequencies lower than 1000 Hz may also be used, although use of such low frequencies affects the speed at which the measurements are made. In one example, the throughput is 30 wafers per hour, or 120 seconds per wafer, with each wafer having a measurement taken at least ten times in a single region 128, at different power levels. The ten measurements constitute a power curve in this example. As the abruptness measurement requires several reflectance measurements (e.g. requires a number of reflectance measurements for each of a corresponding number of average carrier concentrations), profiler 103 takes several seconds (e.g. 10 seconds) for each wafer 104/105/106. Hence, the 10 millisecond speed of reflectance measurement per power level allows for real time control in the fabrication of wafers by system 100 (FIG. 1A), using method 200 (FIG. 2A).

Although generation beam 151 is modulated, probe beam 152 is operated continuously at constant power (without modulation). The just-described act of modulating only one of beams 151 and 152 allows separation in measurement of two reflectances: a reflectance caused by the excess carriers from the background reflectance, since the former changes at the modulation frequency and can be detected in a synchronous manner by a lock-in amplifier.

In another implementation of act 130, instead of using beam 151 of photons, profiler 103 uses a beam of charged particles, such as electrons or ions. The beam of charged particles is modulated and focused in the same manner as that described above in reference to beam 151 to generate the charge carriers in doped region 138. Instead of a beam of photons or a beam of electrons, any other mechanism (such as a combination of photons and electrons) can be used to create charge carriers in act 130 (FIG. 2A).

Next, in operation 140, profiler 103 (FIG. 1A) measures a property that is affected by charge carriers present in doped region 138 in a wafer 105/106. In one implementation, profiler 103 measures the reflectance that is thereafter used to determine one or more properties such as anneal temperature, junction depth, and abruptness. In act 140, instead of the reflectance, profiler 103 can measure other properties affected by the created charge carriers, such as the refractive index.

Specifically, one implementation of profiler 103 generates and focuses (see act 141 in FIG. 2A) on a region (also called "illuminated region") 128 illuminated by beam 151, another beam 152 (FIG. 2D) that is used to detect the number of charge carriers in wafer 104/105/106 when illuminated by beam 151. In one embodiment, probe beam 152 contains photons having energy lower than the bandgap energy of the semiconductor material in illuminated region 128. Such a probe beam 152 avoids the creation of measurement-related carriers when beam 152 is incident on illuminated region 128, thereby to maintain the charge carrier concentration the same prior to and during measurement (see acts 142 and/or 143 in FIG. 2A) of a property as described below.

Next, profiler 103 measures (see act 142 in FIG. 2A) the intensity of a reflected portion of beam 152 (FIG. 2D) that is modulated at the frequency of modulation of the charge carriers in illuminated region 128. The intensity measurement provides an indication of an average concentration $n_{av}$, of charge carriers in doped region 138 near surface 153 (FIG. 2D), wherein the average concentration $n_{av}$ is a root mean square average that is measured over the period of one (or more) modulation cycle(s) at the modulation frequency of generation beam 151. A number of such concentration measurements $n_{av}$ in turn indicate, under certain conditions as discussed below, a material property, e.g. the abruptness of a junction in doped region 138. Specifically, in act 150, a parameter used in creating charge carriers in act 130 is changed, e.g. the power of beam 151 is changed, and act 142 is repeated, thereby to yield n measurements.

Instead of measuring intensity of beam 152 reflected by the charge carriers directly (as illustrated by act 142), in another embodiment, intensity of an interference of the reflected portion of beam 152 is measured (see act 143 in FIG. 2A). Interference of the reflected portion of beam 152 can be with (1) another portion of beam 152 that is reflected by the front surface of the wafer, or (2) a reference beam that has a time-varying phase. Interference of the reflected portion of beam 152 can also be with an un-reflected portion of beam 152, so as to obtain a sum component and a difference component, and a difference between the sum component and the difference component is used as a measurement. In yet another implementation, the portion of beam 152 reflected by the charge carriers (which varies at the modulation frequency) is interfered with one portion of a reference beam, and the portion of beam 152 reflected by the front surface (which is steady and not varying at the modulation frequency) is interfered with another portion of the reference beam, and the phase difference between the two interference signals is used as a measurement.

Figure 2D:
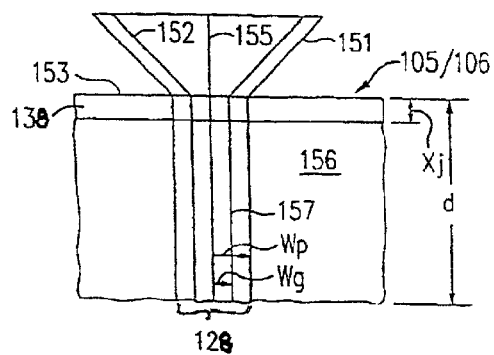
FIG. 2D illustrates, in a cross-sectional view, use of a probe beam and a generation beam, each beam focused coincident with the other by the active dopant profiler of FIG. 1A.
Figure 2E:
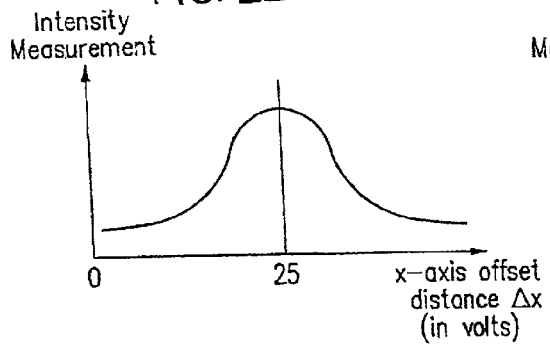
FIGS. 2E and 2F illustrate, in graphs, variation of a measurement of intensity of a portion of the probe beam reflected by the wafer of FIG. 1A, as a function of a piezoelectric voltage that controls the distance between the two beams of FIG. 2D along axis x (FIG. 2E) and axis y (FIG. 2F), the two axes being illustrated in FIG. 2H.
Figure 2F:
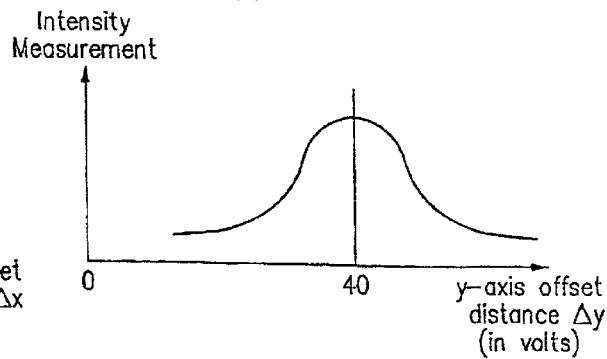
Figure 2G:
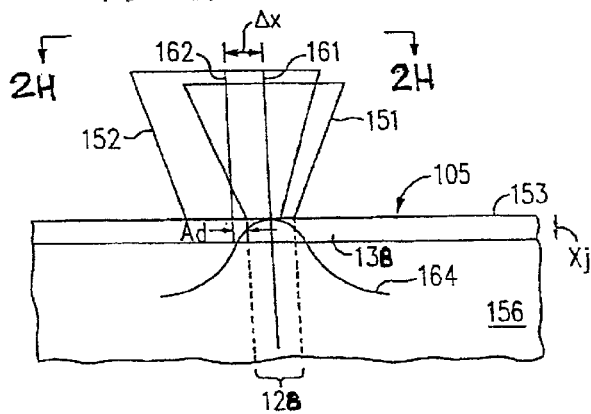
FIGS. 2G and 2H illustrate, in a cross-sectional view and a plan view respectively, beams 151 and 152 of FIG. 2D offset from each other, (and also superimposed in the view of FIG. 2G is a graph of the concentration 164 of excess charge carriers as a function of the distance from axis 161 of generation beam 151).
Figure 2H:
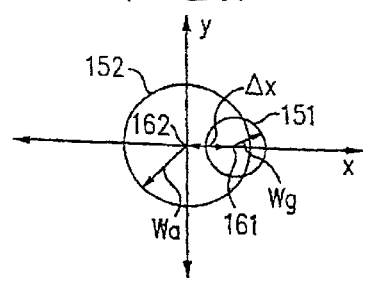
Figure 2I:
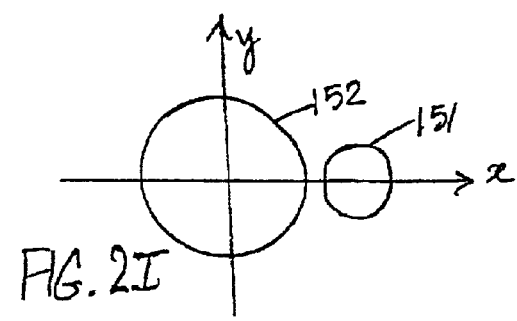
FIG. 2I illustrates, in a plan view, beams 151 and 152 separated from each other.

Although in FIG. 2D, beams 151 and 152 are illustrated as being coincident, with a common axis 155, in another embodiment illustrated in FIG. 2I one of the beams, e.g. probe beam 152, is displaced with respect to the other beam to obtain an intensity measurement, e.g. location of generation beam 151 is changed on performance of one variant of act 244 (FIG. 2A). So beams 151 and 152 are separated each from the other as illustrated by a non-zero distance Δx between the respective axes 162 and 161 in FIG. 2G.

An intensity measurement obtained in such an offset position (FIG. 2G) of probe beam 152 with respect to generation beam 151 is used to measure various properties of the semiconductor material in doped region 138 a manner similar to the measurements obtained from coincident beams (FIG. 2D). The measurement obtained in the offset position (FIG. 2G) provides a measure of carrier concentration, because the concentration decays with distance d from illuminated region 128. Also, the offset is on the order of the diffusion length in layer 138 (and the diffusion length is on the order of 5 μm in a heavily doped layer).

Note that in one embodiment, the offset is fixed throughout the measurement process, for multiple measurements in different locations, unlike the process described in U.S. Pat. No. 5,978,074. Depending on the embodiment, other differences from U.S. Pat. No. 5,978,074 include, for example, use of a modulation frequency that avoids creation of a wave (as opposed to use of frequencies greater than 100 kHz), use of a fixed beam size throughout the measurement process (as opposed to variation in beam size) and for multiple measurements in different locations, use of monochromatic light (as opposed to use of polychromatic light), and use of a photodetector (as opposed to a spectrometer).

Depending on tolerances in alignment, and properties of the beams such as the diameter and angle of divergence from a central axis, it is possible for probe beam 152 to be larger in diameter than generation beam 151 (as illustrated in FIG. 2H). In one embodiment, measurements in such a configuration are made and used as described herein. Also, in an alternative embodiment, measurements at various diameters of beam 151 or beam 152 or both may be made and used in the absence of generation of a wave of charge carriers, as described herein.

In another embodiment, probe beam 152 has a diameter that is smaller than or equal to the diameter of generation beam 151 and is used to eliminate the effect of lifetime variations on the measurements of mobility and doping concentration (as described herein). The smaller size of probe beam 152 is achieved (as illustrated in FIG. 2D) by enlarging the diameter and/or the divergence angle of generation beam 151, e.g. by moving a lens used to generate beam 151, or choosing a lens size that creates a smaller collimated beam diameter as emitted from the generation laser.

Note that in act 150, instead of changing the power of generation beam 151, another embodiment of profiler 103 changes a diameter of beam 151 that also changes the concentration of charge carriers in region 128. In such an approach (that avoids generation of a wave of charge carriers), profiler 103 overlays the axes of both beams 151 and 152 and starts with probe beam 152 larger than generation beam 151. Then, profiler 103 gradually expands the size of generation beam 151 until beam 151 is as large as probe beam 152. During the process, profiler 103 measures the reflectance at each of a number of sizes of the generation beam 151, and plots these measurements to obtain a curved line, followed by determining various attributes (e.g. coefficients) for the curved line. Therefore, profiler 103 compares the coefficient values for a region (e.g. through a graph) with coefficient values of regions having known material properties, thereby to interpolate one or more material properties (such as lifetime and/or diffusion length) of the region. Profiler 103 can also change another parameter related to charge carriers when making such measurements, as would be evident to a person skilled in semiconductor physics in view of the disclosure.

Although in the above-described embodiments, a probe beam 152 having photons of energy below the bandgap energy of wafer 156 is used (to avoid the creation of measurement-related carriers during the measurement), in another embodiment a small percentage (e.g. less than 10%) of charge carriers in addition to the charge carriers created by generation beam 151 are created by use of a probe beam 152 (same reference numeral is used for convenience) having photons of energy at or slightly above (e.g. 10% above) the bandgap energy. The measurement-related carriers created by such a probe beam 152 are in a sufficiently small percentage (e.g. an order of magnitude smaller than the number created by the generating beam) to provide a reasonably accurate measurement of reflectance (e.g. to within 5%).

The overall accuracy of a measurement as described herein is also governed by other inaccuracies involved in the act of measuring, e.g. inaccuracies in a measurement device, such as an amplitude detector. Therefore, in one embodiment the inaccuracy caused by the measurement-related carriers is kept only as small as necessary to maintain the overall accuracy below a predetermined limit. Specifically, the percentage of measurement-related carriers is kept sufficiently small when the rate per unit volume of the carriers generated by generation beam 151 (obtained by dividing the photon flux per unit area by the absorption length), is at least one order of magnitude (or more) larger than for probe beam 152.

The photon flux per unit area described above is the number of photons per unit energy obtained by dividing the power P of generation beam 151 by the area ($\pi W_0^2$) of illumination by Plank's constant h and the ratio of the speed c of light to the wavelength λ as shown in the following formula: photon flux=$(P/\pi W_0^2) \times (1/h(c/\lambda))$. The absorption length is the depth from surface 153 at which the intensity of generation beam 151 drops to (1/e) of the intensity at surface 153.

In one implementation, the intensities of beams 151 and 152 are kept approximately equal (e.g. 100 milliwatts per cm$^2$), and the number of charge carriers (also called "measurement-related carriers") created by beam 152 is less than 10% of the number of charge carriers (also called "excess carriers") that are created by generation beam 151 due to the difference in absorption lengths. Note that in other implementations, beams 151 and 152 can have powers different from each other (e.g. 100 milliwatts and 25 milliwatts respectively), and yet maintain the number of measurement-related carriers at a negligible percentage. For example, probe beam 152 can have photons of energy greater than the bandgap energy, if the power of probe beam 152 is sufficiently less than the power of generation beam 151 (to keep the measurement-related carriers at a negligible percentage).

In one implementation, probe beam 152 has a generation rate one or more orders of magnitude smaller than the generation rate of generation beam 151. As noted above, the difference in generation rates is obtained by using beams 151 and 152 that have different absorption lengths in the semiconductor material of wafer 156, or by generating beams 151 and 152 at different powers or different diameters, or all of the above. In various implementations, the pair of beams 151 and 152 are generated by one of the following pairs of lasers: (AlGaAs, InGaAs), (Ar, InGaAs), (NdYAG, InGaAs), and (NdYAG, AlGaAs).

In one or more of the implementations, e.g. for use of lasers (NdYAG, AlGaAs), the power of probe beam's laser (e.g. AlGaAs) is maintained less than the power of generation beam's laser (e.g. NdYAG) because the absorption length of the probe beam is a fraction (e.g. one-tenth) of the absorption length of the generation beam. In another example, a probe beam 152 formed by a HeNe laser is maintained at a power less than or equal to ¼$^{th}$ power of generation beam 151 formed by an Ar laser (having an absorption length 1.2 μm that is ¼$^{th}$ the 3.0 μm length of the HeNe laser beam). In the just-described implementation, the power of the reflected portion of probe beam 152 is maintained large enough (by having a sufficiently large power of probe beam 152) to be detected with sufficient accuracy (e.g. with error of 5% or less) required for reflectance measurements as described herein.

In one variant of this implementation, the difference between the generation rates of beams 151 and 152 is one order of magnitude only at surface 153 (FIG. 2D). In a second variant, the order of magnitude difference is maintained throughout junction depth "Xj" of doped region 138 in wafer 105/106, e.g. throughout depth of 0.3 microns. In a third variant, the order of magnitude difference is maintained throughout a predetermined fraction (e.g. ½) of the junction depth Xj.

In an alternative embodiment, a significant number (e.g. greater than 10%) of charge carriers are measurement-related carriers (of the type described above) that are created by incidence of probe beam 152. Such measurement-related carriers bias the junction, and a signal is measured, for different powers of probe beam 152. A second order coefficient of the function is used to determine a property (such as abruptness) of wafer 104/105/106.

As noted above, depending on the wavelength, probe beam 152 generates measurement-related carriers, that in turn bias the junction. One embodiment uses the measurement-related carriers to determine abruptness or other properties as follows. Specifically, measurements of the intensity of probe beam 152 are made as described in reference to act 142 of FIG. 2A, except that multiple measurements are made for different powers of probe beam 152. When making the measurements, the intensity of generation beam 151 is kept at a constant amplitude of modulation (e.g. 25 mA). The constant modulation amplitude is selected to be at a lower end of a range (in which the amplitude is normally varied to generate a power curve), because abruptness induced effects are more exaggerated at low powers. At low powers of generation beam 151, the effects caused by other than abruptness are minimized, so that abruptness can be measured by varying the intensity of probe beam 152.

In this embodiment, a power curve need not be in fact generated, but a measure of its slope is obtained, because modulation of generation beam 151 results in the measured signal being indicative of slope of the power curve. Specifically, the signal being measured is due to intereference of two portions of probe beam 152 that are modulated and that are reflected from a front surface of the wafer, and from a junction, as described elsewhere herein. After a first measurement, the probe beam's intensity is changed, and the signal is measured again, to obtain a second measurement.

A difference between the two measurements is an indicator of abruptness (e.g. varies linearly as abruptness) because at different powers of the probe beam the interference signal comes from different depths. So, the just-described procedure is repeated (e.g. on another wafer or on another die in the wafer), for process control (e.g. a fabrication parameter related to abruptness is adjusted if the difference between measurements on one wafer is not same as the corresponding difference on another wafer). Note that although the just-described embodiment uses only two measurements on each wafer, in other embodiments, additional measurements may be made (at different powers of the probe beam).

Another embodiment modulates both probe beam 152 and generation beam 151, at frequencies that differ from one another. Therefore, both the probe beam and the generation beam are modulating the number of charge carriers at the junction. The width of the depletion region of the junction is a non-linear function of the modulation. Hence, a reflection signal from the junction appears at the sum and difference frequencies. Therefore, the apparatus makes measurements as described above, but looks for a signal at the sum or difference in frequencies of modulation of the two beams. Since the mixing in the measured signal is caused by a non-linear response, this is the equivalent of measuring the quadratic and higher fit coefficients (such as cubic and quartic) of a power curve function. The measured signal is a function of both depth and abruptness. Such a signal is therefore plotted and analyzed just like a power curve generated with zero modulation of the probe beam.

Regardless of the different ways in which measurements are performed on wafer 104/105/106, the measurements are used (in an operation 160 illustrated in FIG. 2A) to determine one or more coefficients, such as the zeroth order, first order, and/or second order coefficients of a function that describes the measurements. In one embodiment, two or more of the reflectance measurements made in act 143/144 (FIG. 2A) are used to measure a material property of wafer 104/105/106.

Figure 2J:
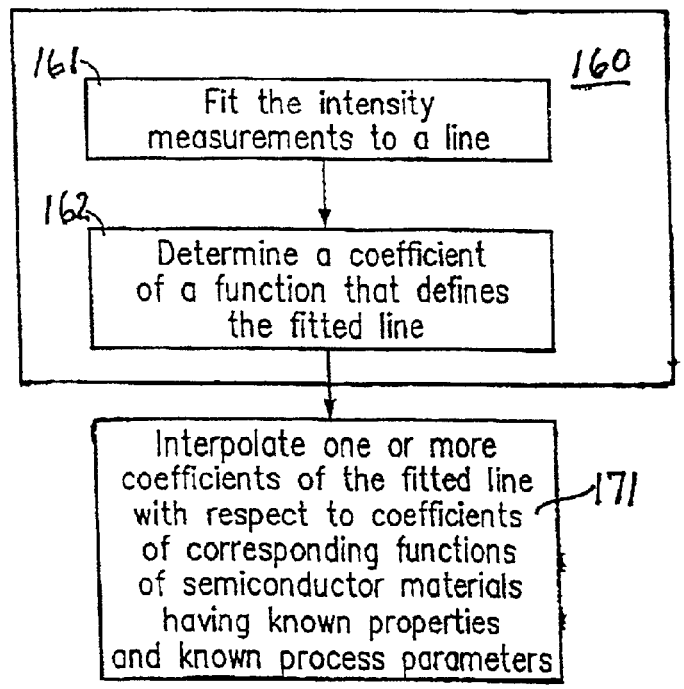
FIG. 2J illustrates, in a flow chart, the acts performed by computer 103C of FIG. 1A to use a coefficient of a power curve in evaluating a wafer.
Figure 3A:
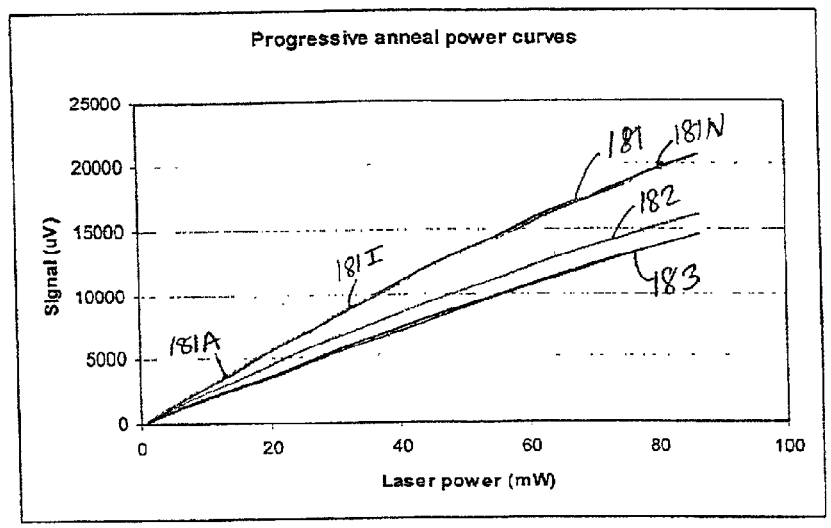
FIG. 3A illustrates, in a graph, intensity measurements (made by the profiler of FIG. 1A) plotted along y axis as a function of power of the generation beam for three wafers, wherein the intensity measurements have been normalized.

Specifically, in act 161 (FIG. 2J), profiler 103 fits the reflectance measurements to a line, such as curved line 181 (FIG. 3A). Curved line 181 is a plot (along the y axis) of the intensity of the component of probe beam 152 appearing at the modulation frequency of generation beam 151 (FIG. 2D) after reflection by region 128, as a function of the parameter being varied (along the x axis), e.g. power of generation beam 151 incident on region 128. Profiler 103 (FIG. 1A) uses points 181A–181N obtained by each of the intensity measurements to fit a curved line 181 (FIG. 3A) for a wafer (e.g. by connecting points 181A–181N with line segments).

Next, in act 162 (FIG. 2J), profiler 103 determines one or more attributes that describe curved line 181, e.g., determines the first order coefficient (also called "slope") and the zeroth order coefficient (also called "intercept") of one or more straight lines that approximate various portions (e.g. two portions described below) of curved line 181, and/or determines an inflection point (e.g. a point at which a second or higher order derivative becomes zero). In alternative implementations, instead of using straight lines, computer 103C uses quadratic or higher order functions that approximate curved line 181, e.g. to obtain three or more such coefficients.

In one such alternative implementation, programmed computer 103C generates a number of curved lines 181–183 (FIG. 3A) from intensity measurements on the respective wafers. Specifically, FIG. 3A illustrates measurements plotted in a graph with the y axis representing the measured intensity and the x axis representing the power of generation beam 151. For example, profiler 103 obtains a number of measurements 181A–181N (FIG. 3A) with beams 151 and 152 coincident in the same region 128 (FIG. 2D) by changing the power of the generation beam 151. The intensity measured is of interference between a portion of beam 152 reflected by the front surface 153 and another portion of beam 152 reflected by the charge carriers that is modulated in phase with modulation of beam 151. This is the signal plotted on the vertical scale of the graph in FIG. 3A.

Thereafter, computer 103C uses the measurements to determine curved line 181 and/or its coefficients (e.g. curvature). In FIG. 3A, lines 181–183 were determined from measurements made over a range of 80 mW power, for the following wafers (not shown) that were boron doped using a chemical vapor deposition method to form a shallow layer (on the order of 10 nm): (1) a first wafer that was measured directly after deposition, (2) a second wafer that was spike annealed to a maximum temperature of 750° C., and (3) a third wafer that was spike annealed to a maximum temperature of 800° C. In spike annealing, a wafer is heated at a fast ramp rate, for example, 100° C./second to a maximum temperature and immediately ramped down in temperature at a similar rate. Note that no normalization was done to determine lines 181–182 of FIG. 3A, although the measurements used in other embodiments may be normalized.

As seen from FIG. 3A, the quadratic coefficient for lines 181–182 (also called "curvature") varies as a function of the abruptness of the junction. Specifically, the quadratic term becomes increasingly negative as the profile becomes increasingly abrupt across lines 181–182. The second wafer with an higher temperature anneal is expected to have less abruptness because the junction forming dopant atoms diffuse, and as illustrated by line 182 has less curvature than line 183 which represents an as-grown wafer. The lowest abruptness is expected in the first wafer since it has been annealed at the highest temperature, causing the greatest diffusion.

Figure 3B:
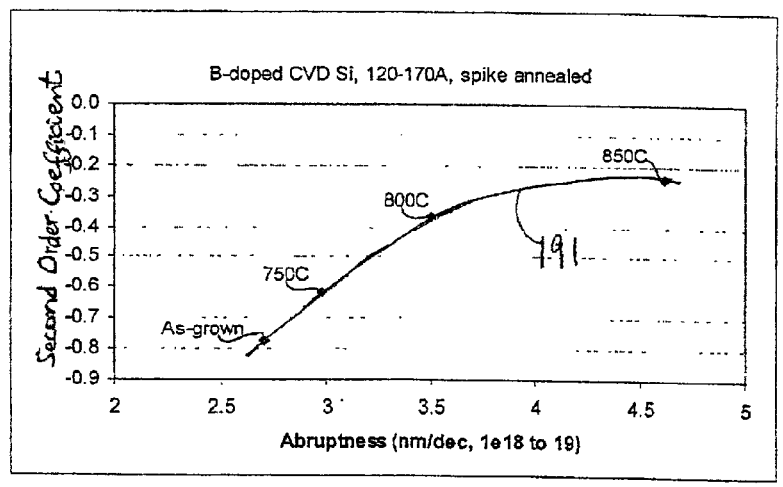
FIG. 3B illustrates in a graph, change in curvature (along the y axis) of the power curves of FIG. 3A as a function of anneal temperature (along the x axis).

In one implementation, the properties and process conditions of wafers represented by lines 181–182 are known (as these wafers are 'reference wafers'), and such properties are plotted as functions of one or more of the above-described coefficients, e.g. second order coefficient (along the y axis) is illustrated in FIG. 3B as a function of anneal temperature. Thereafter, the corresponding coefficient of a newly fabricated wafer is used to look up the respective properties and/or processing conditions.

Specifically, in the example illustrated in FIG. 3A, curved lines 181–182 have the following fit coefficients, anneal temperature and abruptness, as shown in Table 1.

TABLE 1

| Line | Zeroth-order | First-order | Second-order | Anneal Temperature in Degrees Centigrade | Abruptness nanometers/decade |
|---|---|---|---|---|---|
| 183 | −56.1 | 210.63 | −.414 | 800 | 3.50 |
| 182 | −111.4 | 244.5 | .674 | 750 | 2.98 |
| 181 | 86.79 | 307.28 | −.766 | As-grown | 2.71 |

Abruptness is measured in units of nanometers/decade which is the distance in nanometers over which the concentration of dopants drops by a factor of 10. For example, if the concentration drops from $10^{19}$ atoms/cm$^3$ to $10^{18}$ atoms/cm$^3$ in a distance of 2.5 nm, then abruptness is 2.5 nm/decade.

Figure 4:
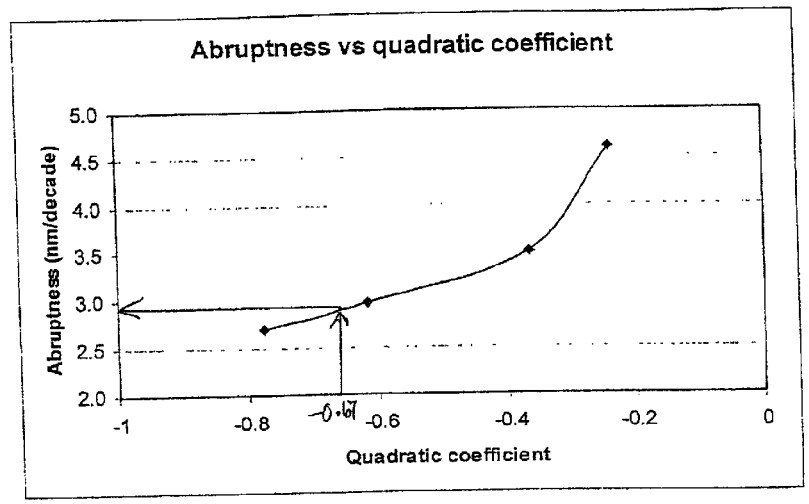
FIG. 4 illustrates a graph used to convert curvature (along the x axis) obtained from measurements into anneal temperature (along the y axis).
Figure 5:
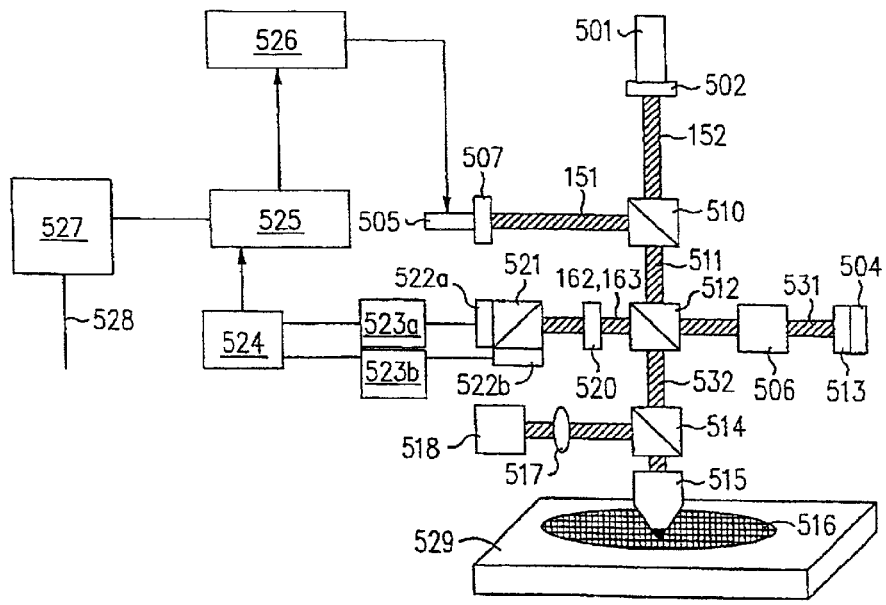
FIG. 5 illustrates, in a block diagram, various components used in one implementation of the active dopant profiler of FIG. 1A.

In one example, computer 103C uses the second order coefficient of value−0.674 as illustrated in FIG. 4 to obtain the abruptness of 2.98 nm/decade. In the above-described example of the wafer represented by curved line 183, programmed computer 103C compares the measured value of 2.98 nm/decade to the specification of 2.8 nm/decade, and identifies the wafer as being rejected (e.g. by moving the wafer into a bin of rejected wafers), and thereafter adjusts a process parameter e.g. drives a signal on line 108 (FIG. 1A) to reduce the temperature by 25° C.

Instead of, or in addition to determining a process condition (e.g. anneal temperature as described above), the above-described attributes derived from the intensity measurements can be used to determine abruptness of the semiconductor material in illuminated region 128. Specifically, profiler 103 uses the curvature to determine junction abruptness by looking up a graph (FIG. 3B) of such curvatures plotted against abruptness of wafers having known properties. In the above-described example, the second order coefficient yields abruptness of nanometers per decade through direct use of a correlation graph such as FIG. 3B.

Thereafter, profiler 103 compares the value of for example, 2.8 nanometers/decade with a predetermined range of acceptable abruptness e.g. the range of 2.7 to 2.9 nm/decade. As the value of 2.8 falls within the range, wafer 105/106 is identified as acceptable, and is processed further in the normal manner (as illustrated by act 262 in FIG. 2A). If the measured junction depth falls outside the predetermined range, wafer 105/106 is rejected (as illustrated by act 260 in FIG. 2A), and one or more process conditions are adjusted e.g. by adjusting the addition of dopants (as illustrated in act 263).

Note that the above-described coefficients can be extracted from the respective measurements using any curve-fitting method well known in the art. For example, a "least squares" fit may be performed, to minimize the mean squared deviation between a function and the measurements. Assuming the measurements form a matrix ($S_i$, $P_i$), where the $i^{th}$ signal is measured in response to the $i^{th}$ power, the mean squared deviation MSD is given by the following equation.

$$MSD = \sum [S_i - f(P_i)]^2$$

To find a minimum MSD, a quadratic function $f(P_i)=a+bP_i+cP_i^2$ is fitted to the measurements, to determine coefficients a, b and c, e.g. by taking the partial derivative of MSD with respect to a, b and c and setting these to zero. Such methods are well known and implemented in standard curve-fitting routines, such as those found in Microsoft Excel which provides a "trendline" option to automatically fit coefficients. Alternatively, a, b and c can be found using a matrix solver in a program such as Mathcad, or custom routines may be written and embedded within user interface or data analysis software associated with the measurement system.

In one embodiment, a quadratic function fits the measurements to a high degree of accuracy (e.g. to within 10%), so that it is not necessary to use higher order terms or fit functions other than power series. However, fits to higher order terms of a power series may be performed, e.g. to increase accuracy in the abruptness measurement, or in other embodiments other functions may be fit to the measurements, to extract abruptness from fit coefficients, as would be apparent to the skilled artisan.

One or more of these coefficients are used (see act 172 in FIG. 2A) to determine if wafer 104/105/106 conforms to the specification for such wafers, e.g. curvature below a predetermined limit. If wafer 106 conforms to the specifications, wafer 106 is identified (see act 173 in FIG. 2A) as acceptable (e.g. by movement in the direction for further processing) and the conditions in wafer processing unit 101 (FIG. 1A) and in rapid thermal annealer 102 are left undisturbed. Thereafter, the above-described acts are repeated on another wafer or after further processing on the same wafer.

If a wafer 106 does not conform to the specifications, wafer 106 is identified as unacceptable (e.g. discarded) and optionally profiler 103 is used (in act 174 in FIG. 2A) to adjust (either automatically or under manual control) (1) the conditions (e.g. dosage of dopants) in unit 101 by driving a signal on a line 107 (FIG. 1A), or (2) the conditions (e.g. annealing temperature) in annealer 102 by driving a signal on line 108, or both. Then the above-described acts are again repeated.

Note that the adjustment of a process condition can also be performed even when a wafer is accepted (as illustrated by act 173 in FIG. 2A), e.g. if the abruptness falls close to the limits of a predetermined range, e.g. within 5 percent of a limit. As noted above, to adjust the process condition, profiler 103 provides a signal to either or both of unit 101 and annealer 102 to return the value of the abruptness into the middle of the predetermined range.

As described herein, the measurement performed by profiler 103 is non-destructive, is performed in a few square microns, and can be performed in a relatively short time (e.g. five seconds in one region or 50 seconds at 10 regions over a wafer). Measuring a property of annealed wafer 106 during (or immediately after) fabrication as described herein increases yield, as compared to an off-line measurement of a test wafer's properties.

Note that instead of directly using the second order coefficient, the coefficient can be interpolated (as illustrated in act 171 illustrated in FIG. 2J) with respect to coefficients of wafers having known junction abruptness, to identify abruptness of wafer 104/105/106. For example, the second order coefficient for wafer 104/105/106 is compared with corresponding coefficient values of wafers (also called "reference wafers") that have known abruptness, to find the two closest coefficient values, and a linear interpolation between the corresponding abruptness values yields abruptness of wafer 104/105/106. Instead of linear interpolation, a curve may be fitted to relate different coefficient values to the respective abruptness values, and the curve (see FIG. 4) is then used to find abruptness of wafer 104/105/106.

Abruptness of reference wafers can be determined (see act 110 in FIG. 2A) in any manner well known in the art, such as spreading resistance profile (SRP)) or by Secondary Ion Mass Spectrometry (SIMS). Also, instead of using an empirical method to determine properties of reference wafers, simulation may be used. In one implementation, software in computer 103C compares a simulated power curve with a corresponding curve (see curve 181 in FIG. 3A) obtained by measurement of an interference signal (amplitude and phase, wherein phase is used to determine a sign to be used with the amplitude) as a function of the power of generation beam 151. Specifically, to find curvature for a wafer being tested, the software compares the measured power curve to a number of preexisting power curves that have been obtained by simulation (e.g. by use of the simulators Atlas and Athena, both available from Silvaco International, Santa Clara, Calif.). The matched curvature obtained by simulation determines the abruptness.

In one implementation, the abruptness (or the second order coefficient itself, depending on the embodiment) of wafers undergoing the same fabrication process, if smaller than or equal to a predetermined limit identify acceptable wafers. For example, if abruptness of wafer 105/106 is greater than or less than a maximum limit or a minimum limit respectively, wafer 1015/106 is identified as unacceptable (e.g. by placing in a bin of rejected wafers). In one implementation, computer 103C displays on monitor 103M a message indicating that measurements identify a wafer 104/105/106 as unacceptable, while in another implementation computer 103C drives a signal to a robot (not shown) to move wafer 104/105/106 into a bin of rejected wafers (if rejected). The acceptable wafers are processed further in the normal manner (see act 262 in FIG. 2A).

In some embodiments, a maximum limit on abruptness is set empirically by comparing the above-described abruptness of one or more reference wafers (wherein the reference wafers are known to be good or bad based on electrical tests for conformance to the specification for such wafers), thereby to identify a maximum limit on the abruptness for acceptable wafers. The empirical method used can be any method such as one of the methods described in "STATISTICAL QUALITY CONTROL HANDBOOK" available from AT&T Technologies, Commercial Sales Clerk, Select Code 700-444, P.O. Box 19901, Indianapolis, Ind. 46219, phone 1-800-432-6600, second edition, 1958.

Specifically, the variations in such abruptness are correlated with the performance of a reference wafer during electrical tests that identify reference wafers (that are good). In one example, four different wafers have 1%, 5%, 10% and 20% variation from abruptness of an epitaxial wafer, and have the respective variations in performance speed of 8%, 10%, 20% and 25% during electrical testing of integrated circuit dies formed from the respective wafers.

Assuming that 10% and greater variation in speed is unacceptable, a maximum limit is set for this example at 5% variation. Therefore, all wafers having abruptness lower than 5% from the maximum limit are identified as acceptable wafers (as illustrated by act 173 in FIG. 2A). Note that if the abruptness of a number of wafers that have been successively processed are close to the maximum limit (e.g. all greater than 4.5% in the just-described example), one or more parameters used in processing the wafers may be adjusted (e.g. as described herein in reference to act 174 of FIG. 2A) even though none of the wafers are discarded.

In another implementation, instead of determining abruptness in one location and comparing the abruptness to a predetermined limit, abruptness values at multiple locations are plotted, e.g. values along a line are plotted in a graph, to form a "linear" scan. In addition, operation 140 is used in one implementation to screen out starting wafers formed of bare silicon with an epitaxial layer grown by Chemical Vapor Deposition (CVD) used for the start of the process (e.g. starting wafers with thin epitaxial layers, to measure the depth and abruptness of the epitaxial layers).

Anneals are typically done by heating the wafer rapidly with lamps (not shown) in annealer 102 (FIG. 1A). The illumination by the lamps in annealer 102 may not be uniform, and the amount of heat that enters a patterned wafer 105 at any point may be a function of the thickness of dielectric layers (such as silicon dioxide or silicon nitride to be formed on surface 153), and the integrated circuit pattern therein. Specifically, the different layers (not shown) in wafer 105 reflect different amounts of power, thereby causing variations in the amount of heating of wafer 105.

Thus annealing of implanted wafer 105 may not be uniform, and the characteristics of a junction (formed at an interface between doped region 138 and semiconductor material 156 in FIG. 2D at a depth xj from surface 153) in annealed wafer 106 may vary from point-to-point. Lines 181–183 (FIG. 3A) indicate to a person skilled in semiconductor physics the variations in junction abruptness on a micron and sub-micron scale. Therefore, such lines are used by a human operator of profiler 103 to check if the just-formed transistors are uniform all across wafer 105/106, and to conform to specifications (e.g. by adjusting the anneal, implant or circuitry design) the transistors in a to-be-formed wafer.

Instead of a human operator, such checking is automated by computer 103C in another embodiment. For example, instead of forming a display (not shown), computer 103C (1) automatically uses the abruptness values from each wafer to compute the mean and standard deviation values, over a large number of wafers (typically several hundred or more), and (2) automatically uses these values of mean and standard deviation to identify when an implant or anneal process is out of specification, using statistical process control methods that generate control parameters (as described in pages 5–30 of the above-referenced book from AT&T Technologies, and these pages are incorporated by reference herein) to be provided to unit 101 or annealer 102.

As noted above, although a linear scan is discussed above, an area scan is performed in another embodiment. Specifically, profiler 103 (FIG. 1A) performs a number of reflectance measurements in a corresponding number of regions (e.g. by repeating acts 140–160 in FIG. 1A) in a closely spaced grid (e.g. a grid that divides a wafer 105/106 into a number of regions, each region having an area 10 microns by 10 microns). The measurements are plotted to form on monitor 103M (FIG. 1A) a graph of the measured intensity vs. x-y position (e.g. in the form of various types of hatched regions or as a three dimensional image).

Therefore in the just-described embodiment, profiler 103 functions as a scanning abruptness microscope that displays on monitor 103M the abruptness of various regions on wafer 104/105/106, and can be used in a manner similar to the use of a scanning electron microscope. In one example, four hundred measurements are taken in an area of 100 $\mu$m×100 $\mu$m and displayed in a three dimensional graph wherein the x and y axes define, in the two dimensions, a region on patterned wafer 105, and the hatch pattern (that is displayed on monitor 103M in a third dimension) indicates the measured abruptness. Such a graph (not shown) of the area scan is used by an engineer skilled in semiconductor physics to evaluate wafer 105/106, in a manner similar to the use of a scanning electron microscope. As noted above, instead of plotting a graph to be manually checked, the abruptness measurements are checked automatically.

If necessary, profiler 103 can move beams 151 and 152 relative to one another at any time (e.g. before, during or after identifying a wafer as accepted/rejected as shown by act 170 in FIG. 2A), although in one embodiment the distance between beams 151 and 152 is set initially and thereafter kept fixed for all measurements. Beams 151 and 152 may be initially arranged to be concentric and/or overlapping, or nonoverlapping (depending on the implementation) by appropriately adjusting the separation distance during setup. In such an embodiment, no measurements of the type described herein are made during the setup phase, and when such measurements are made after the setup phase, the separation distance is left unchanged.

In one embodiment, profiler 103 includes two piezoelectric actuators that control the positions of beams 151 and 152. Specifically, the actuators (not shown) move a collimating lens of a laser that generates probe beam 152 along each of two orthogonal axes x, y that are both perpendicular to axis 155 of generation beam 151, thereby shifting the position of probe beam 152 relative to generation beam 151.

Profiler 103 may align beams 151 and 152 to be coincident in the following manner. Specifically, profiler 103 repeatedly moves probe beam 152 relative to probe beam 151 along an axis (e.g. along x axis), as illustrated in FIGS. 2G and 2H and obtains an intensity measurements after each movement. In one embodiment, the measurements are made as part of a setup phase, and profiler 103 does not process the measurements between movements to determine material property). In an alternative embodiment, such measurements are processed to determine a material property, while profiler 103 avoids generation of a wave of charge carriers, by using a sufficiently low modulation frequency as described elsewhere herein.

After making the measurements, profiler 103 optionally plots the measurements as a function of the relative position as illustrated in FIG. 2E, and determines the position (in this embodiment the voltage applied to the piezoelectric actuator) at which the intensity measurement is at a maximum, e.g. 25 mV volts in FIG. 2E. In one embodiment, profiler 103 moves probe beam 152 relative to generation beam 151 in a first direction (e.g. along the positive x axis) by an incremental distance Δx (e.g. 0.1 $\mu$m), measures if the measured intensity is larger than the largest intensity so far, and if so, saves the voltage signal that was used to maintain the current total distance between beams 151 and 152 and also saves the measured intensity as the largest intensity. Thereafter, profiler 103 repeats the just-described procedure, until the total distance between beams 151 and 152 reaches or exceeds a predetermined distance, e.g. ½ of the diameter of the larger of beams 151 and 152, wherein the incremental distance Δx is 1/10 of the larger diameter.

Next, profiler 103 moves probe beam 152 relative to generation beam 151 in a second direction (e.g. along the negative x axis) that is opposite to the first direction (e.g. positive x axis), and performs above-described procedure. Profiler 103 treats the first and second direction (negative and positive x axis) travel to be a continuum, and so obtains the voltage signal of 25 $\mu$volts (FIG. 2E) corresponding to the maximum intensity measurement along one axis (e.g. along x axis). Similarly, profiler 103 moves probe beam 152 relative to generation beam 151 along another axis (e.g. y axis) that is orthogonal to the just-described movement, and once again determines the voltage applied to the piezoelectric actuator at which the intensity measurement is maximum, e.g. 40 $\mu$volts in FIG. 2F. Therefore, profiler 103 automatically positions beams 151 and 152, e.g. to be coincident or to have a predetermined separation distance.

Graphs, such as line 191 (FIG. 3B), used to determine a material property or a process condition are generated in one of the two following ways (in two different embodiments). In the first embodiment, a set of wafers (also called "reference wafers") is selected or prepared to have a range of material properties (by varying process conditions, such as implant energy, dose or anneal temperature), and thereafter profiler 103 is used to obtain intensity measurements and generate fit coefficients or other attributes for power curves of each of the reference wafers (as described above). Thereafter, the fit coefficients or attributes are used to plot graphs, such as line 191. In a second embodiment, a number of wafers (also called "reference wafers") are subjected to intensity measurements in profiler 103 (as described above), followed by use of a conventional measurement technique, such as SIMS to determine the actual doping profile therein.

Therefore, after one or more of the above-described graphs (see FIGS. 3B) are prepared, the abruptness of a wafer under fabrication is determined by the above-described method 200 (FIG. 2A) without the need to destroy the wafer, because profiler 103 simply uses the above-described graphs to generate measurements of abruptness. Therefore, profiler 103 eliminates the cost associated with test wafers otherwise required by the prior art method.

Although in the above description, computer 103C has been described as performing various computations for preparation of lines (e.g. line 181 in FIG. 3A) used to measure material properties, such graphs can be prepared by another computer, or alternatively can be prepared manually by performing the above-described acts. Moreover, although in one embodiment the above-described lines (e.g. FIGS. 3B) are prepared, in another embodiment such graphs are not prepared and instead the reflectance measurements are simply used to perform the various acts of method 200 by use of equations related to such graphs. For example, instead of drawing a line 181 (FIG. 3A), the curvature of such a line is determined, and thereafter a predetermined function (which may be determined from test wafers) that maps the curvature to abruptness is used to identify abruptness. Alternatively, curvature itself is reported directly.

Curvature is measured in one embodiment, for instance, by measuring the difference in signal between three points 181A–181N on a power curve 181 (FIG. 3A). Points 181A–181N may be spaced close to one another, e.g. with a 1% difference in powers of generation beam 151. In an alternative embodiment, curvature is measured by measuring the signal using an amplitude modulation of the generation laser with the average power level set at some measurement value, for instance, average power at 60 mW and modulation of ±1 mW reports the slope of the power curve, when the power of the generation beam is at 60 mW (e.g. based on measurements at 61 mW and 59 mW). Similarly, measurement at another power, say 62 mW with the ±1 mW modulation measures another slope. The change in slope is the curvature of the power curve.

In one implementation, beam 152 (FIG. 1C) is a laser beam having a wavelength greater than 1 $\mu$m (the wavelength at which photons have approximately the same energy as the bandgap energy of silicon). Note that the wavelength of beam 152 depends on the bandgap energy and therefore on the specific material in wafer 105/106, and is different for germanium.

In one embodiment wherein a portion of probe beam 152 reflected by front surface 153 (FIG. 2D) interferes with another portion reflected by excess carriers, probe beam 152 is generated by a laser 501 (FIG. 4), that can be a conventional laser diode, such as a 980 mm wavelength InGaAs diode with a maximum power of 70 mW made by Spectra Diode Labs, San Jose, Calif.

In a second embodiment wherein probe beam 152 is interfered with a phase variable beam, laser 501 is a distributed Bragg reflector (DBR) AlGaAs laser with a wavelength of 1083 nm and a power of 50 mW (Spectra Diode Labs, San Jose, Calif.).

A DBR laser is used in the second embodiment because it has a coherence length in excess of a meter. This simplifies interferometer design, since the reference beam length is not critical as long as the difference in path length between the reference beam path and the probe beam path is shorter than the coherence length (the probe beam path length is twice the distance from beam splitter 512 to the wafer 516; the reference beam path length is twice the distance from beam splitter 512 to mirror 513). The output of laser 501 is collimated using lens 502 to provide a collimated beam 503 with a diameter of 3 mm. Lens 502 can be, for example, part number WT-CY3-163-10B-0.5 available from Wave Optics, Mountain View, Calif.

However, in one embodiment wherein interference is between reflection from the junction and the front surface, the coherence length need only be on the order of a micron (e.g. less than 10 microns)—that is the coherence length must be on the order of the path length difference, which is twice the junction depth in this embodiment.

In one embodiment, a generation beam 151 is created by an above bandgap laser 505, such as an AlGaAs diode laser with a wavelength of 830 nm and power of 200 mW, available from Spectra Diode Labs, San Jose, Calif. Profiler 103 includes a lens 507, which is part number 06GLC002/810 available from Milles Griot Corporation, Irvine, Calif. Lens 507 collimates the beam from laser 505 to generate a collimated beam 151 with a diameter of 3 mm. Lens 507 is mounted on a positioner (not shown) for providing motion to beam 151 with respect to beam 152.

The relation between wavelengths of beams 151 and 152 produced by lasers 501 and 505 is a critical aspect in one embodiment and leads to unexpected results, for example when beam 151 contains photons having energy above silicon's bandgap energy and beam 152 contains photons having energy approximately the same as or less than the bandgap energy. In this example, for a silicon wafer the 830 nm and 1083 nm wavelength beams provide one or more benefits described herein.

Wavelength 830 nm is considered particularly suitable for generation beam 151 of this example, because the absorption length in silicon is about 15 microns. Thus, the absorption length is much greater than the junction depth, and creation of excess charge carriers is nearly uniform over the depth of concern in the measurement. Because the photon energy is close to the bandgap energy, photon generation is more efficient, with less energy going directly into heating the semiconductor.

Also, the absorption length at wavelength 980 nm is about 250 microns, and therefore the number of excess carriers being created by such a probe beam 152 is sufficiently low to ensure minimum perturbation to the excess carrier distribution. Moreover, the absorption length at wavelength 980 is short enough that very little reflection from a back surface of the wafer is seen (wafers are typically 600–800 microns thick), since the back surface reflection can potentially cause spurious signals.

Note that silicon has a broad band edge (in contrast to direct bandgap materials such as GaAs, which have a sharply defined bandgap energy). A probe beam 152 with wavelength of 980 nm provides photons of energy within this broad band edge, giving rise to the long absorption length, to minimize carrier generation due to probe beam 152, but also providing sufficient absorption to attenuate beam 152 so that reflections from the back side of the wafer are not seen. For this reason, a probe beam 152 of wavelength of 980 nm is used in this example when inspecting doped junctions in substrates of low doping concentration (on the order of $10^{15}$ dopant atoms per cubic centimeter), where optical absorption due to the presence of free carriers is low.

Beams 151 and 152 are combined using dichroic splitter 510 (such as a partially transmissive mirror (e.g. part number 1918-b available from Dominar of Santa Clara, Calif.), forming a superposed beam 511. Beam 511 passes through a 50:50 beam splitter 512 (e.g. part number 2005 from Dominar) that directs a portion of beam 511 to detectors 522a and 522b (via filter 520 and polarizing beam splitter 521), for use in measurement of an interference signal. The remainder of beam 511 passes through a 90:10 beam splitter 514 (available from Precision Applied Products of Fullerton, Calif., by specifying 93.3% transmission at 0.83 microns wavelength and 90% transmission at 0.980 microns wavelength), and an objective lens 515 (such as a 100×, 0.8 NA lens made by Olympus of Tokyo Japan). Objective lens 515 focuses the combined beam 511 onto wafer 516.

The specifications for beam splitter 514 are selected based on the wavelengths of the generation and probe beams to ensure that a majority of the power is transmitted and a smaller amount (e.g. 10%) of the power is reflected. Note also that probe beam 152 is focused only in a carrier creation region 128 (FIG. 2D) that is formed by focusing generation beam 151 (FIG. 4).

Specifically, because of chromatic aberration, the focal planes of beams 151 and 152 differ slightly. The size of the focal spot for probe beam 152 is smaller than the size of the focal spot for generation beam 151 by virtue of the shorter wavelength of beam 151. If wafer 516 is placed in the focal plane of beam 152, beam 151 will be slightly out of focus and its spot on front surface 153 (FIG. 2D) of wafer 516 (FIG. 4) will be larger in diameter and fully overlay the focal spot of beam 152.

This effect of the spot of beam 151 overlaying the spot of beam 152 can also be achieved by underfilling the objective lens 515 with the generation beam 151, by making the generation beam 151 diameter at the entry to objective lens 515 smaller than the entrance aperture of lens 515, thereby increasing the generation beam spot size.

Light reflected from wafer 516 passes back through objective lens 515, 90:10 beam splitter 514, and into 50:50 beam splitter 512. Half of the light reaching beam splitter 512 is directed back through filter 520 (which is a bandpass filter that blocks the light from beam 151 but passes the light from beam 152). Filter 520 can be, for example, Schott glass RG830, available from Spindler & Hoyer Corporation of Goettingen, Germany. Alternately, filter 520 can be a narrow-band pass filter with a center wavelength of 1080 nm, available from Melles Griot of Irvine, Calif.

Filter 520 removes photons of generation beam 151 from the reflected beam, thereby allowing detector 522a to see only the photons of probe beam 152. Filter 520 is a critical component in one embodiment and provides the unexpected result of eliminating feed-through of the modulated signal (generated by beam 151) to detector 522a that would otherwise be present when using a prior art system. In this particular implementation, germanium may be used in photo detector 522a to provide sensitivity to photons of wavelength 1083 nanometers that are generated by laser 501.

Alternatively, either a germanium or a silicon photodetector may be used in the first embodiment, which uses a probe laser wavelength of 980 nm.

In some embodiments, a reference beam is formed by a portion of probe beam 152 that reflects from front surface 153 (FIG. 2D), and 50:50 beam splitter 512 diverts 50% of the reflected beam from front surface 153 toward detector 522a. Note that in the first embodiment, beam splitter 521, detector 522b, and amplifier 523b are not used (i.e. are not present).

Detector 522a is a photocell (such as a photodiode or a phototransistor, e.g. J16-8SP-RO5M-HS from EG&G Judson of Montgomeryville, Pa., USA) that converts the incident interference signal into a current. Amplifier 523a converts the current to an amplified current which is then sent to an amplifier 524 that in turn is coupled to a lock-in amplifier 525 (such as model 830 available from Stanford Research Systems, Sunnyvale, Calif.).

Lock-in amplifier 525 includes a reference oscillator at the lock-in detection frequency. This oscillator is coupled to a laser driver 526 to provide a signal to laser 505 that is modulated at the same frequency as the signal provided by lock-in amplifier 525. Lock-in amplifier 525 provides a signal indicating the amplitude as well as phase of reflected beam with respect to modulation by laser driver 526 to a processor 527, such as a personal computer running software to capture and display the signal in an appropriate manner (e.g. in a graph). The signal may also be stored in the personal computer (e.g. in a database on the hard disk) for later processing.

In one implementation, personal computer 527 has a line 528 that is coupled to lines 107 and 108 (described herein in reference to FIG. 1A) thereby to control the acts performed by ion implanter 101 and rapid thermal annealer 102 based on measurement of one or more material properties as described herein.

Beam splitter 514 diverts 10% of the return beam from wafer 516 via a lens 517 (such as tube lens 81845 available from—Nikon of Tokyo, Japan) to a camera 518 (such as a CCD camera, e.g. model 85400 available from FJW Industries of Palatine, Ill.). The signal provided by camera 518 is fed into a vision system (not shown in FIG. 4), such as model ASP-60CR-11-S available from Cognex Corporation, Boston, Mass.

Positioning of wafer 516 with respect to the combined beam 511 is accomplished using a microscope that includes stage 529, objective lens 515, beam splitter 514, lens 517 and camera 518. Stage 529 is used to move wafer 106 relative to beam 511 in the X, Y and Z directions. Specifically, stage 529 can be used to move wafer 516 in the vertical direction along the Z axis to adjust focus, and in a horizontal plane to adjust the position of region 120 of FIG. 1E relative to beam 511.

Numerous modifications and adaptations of the above-described embodiments, implementations, and examples will become apparent to a person skilled in the art of semiconductor physics. For example, although computer 103C is described as being programmed with one or more specific equations, computer 103C can be programmed with other equations described herein, or with one or more equations that approximately determine abruptness, for use with measurements performed by profiler 103 while creating a diffusive modulation of charge carriers in a wafer under measurement.

As another example, an approximate equation used by profiler 103 to measure abruptness can be obtained by curve-fitting to measurement data from reference wafers, or by curve-fitting to data obtained from a numerical model, or both depending on the specific implementation.

Moreover, other embodiments may use a function other than a power series as a fit function for the power curve, such as an exponential or trigonometric series, where linear and quadratic terms do not exist, but fit coefficients are used to determine the shape of the power curve, and abruptness or other material properties are determined from such coefficients.

Note that the quadratic (or other higher order) terms of a power series function that fits the power curve may depend on both depth and abruptness. In one implementation, there are two unknowns (depth and abruptness) and two coefficients (first order and second order). In this implementation, the linear term is primarily a function of depth and the quadratic a function of both depth and abruptness. Therefore, the linear coefficient is used to find the depth and the quadratic coefficient to find the abruptness with knowledge of the depth.

Also, the coefficients of a function that describes the power curve are used in one embodiment to extract material properties other than abruptness, such as doping concentration. Also, power curves for various values of a parameter other than the probe beam power can be used to evaluate a semiconductor wafer, e.g. the parameter can be modulation frequency, or spot size or separation distance.

Therefore, numerous such modifications and adaptations of the above-described embodiments are encompassed by the attached claims

What is claimed is:

1. An apparatus for evaluating a wafer, said apparatus comprising:

a first source of a first beam of photons having a first intensity modulated at a frequency sufficiently low to avoid creation of a wave of charge carriers in said wafer when said first beam is incident on said wafer;

a second source of a second beam of photons;

a photosensitive element located in a path of a portion of said second beam, said portion being modulated at said frequency after reflection by said wafer, said photosensitive element generating an electrical signal indicative of a concentration of said charge carriers created in said wafer by incidence of said first beam; and a computer coupled to said photosensitive element and programmed to determine a coefficient of a function that relates said electrical signal to a parameter related to generation of at least one of said first beam and said second beam.

2. The apparatus of claim 1 wherein:

photons in said second beam have energy less than energy of photons in said first beam.

3. The apparatus of claim 1 wherein:

said electrical signal indicates a change in depth of a reflecting region of said wafer as a function of power of said first beam.

4. The apparatus of claim 1 wherein:

said electrical signal indicates a change in a profile of excess carriers as a function of power of said first beam, said excess carriers being created by incidence of said first beam; and energy of photons in said second beam is sufficiently smaller than energy of photons in said first beam to avoid creation of more than a negligible number of charge carriers in said wafer when said second beam is incident on said wafer.

5. The apparatus of claim 1 further comprising:
an oscillator capable of oscillating at a frequency lower than 25000 Hz, the oscillator being coupled to the first source; and
a lock-in amplifier coupled to said oscillator and to said photosensitive element, said lock-in amplifier having an output line.

6. The apparatus of claim 5 wherein during operation:
said oscillator causes said first source to generate said first beam at an intensity modulated at said frequency; and
said lock-in amplifier generates on said output line a signal indicative of an average number of photons of said second beam modulated at said frequency and reflected by said wafer.

7. The apparatus of claim 1 further comprising:
an oscillator coupled to the first source, said oscillator being set to oscillate at a fixed frequency that is sufficiently low to avoid creation of a wave of charge carriers in said wafer; and
a lock-in amplifier coupled to said oscillator and to said photosensitive element, said lock-in amplifier having an output line.

8. The apparatus of claim 1 wherein:
a center of the second beam is coincident with a center of the first beam.

9. The apparatus of claim 1 wherein:
the second beam is incident on said wafer at a location offset from said first beam.

10. The apparatus of claim 9 wherein: a center of the second beam is separated from a center of the first beam by at least one micron.

11. The apparatus of claim 9 further comprising:
an oscillator coupled to the first source, said oscillator being set to oscillate at a fixed frequency that is sufficiently low to avoid creation of a wave of charge carriers in said wafer; and
a lock-in amplifier coupled to said oscillator and to said photosensitive element, said lock-in amplifier having an output line.

12. The apparatus of claim 1 wherein:
photons of said first beam have energy greater than bandgap energy of semiconductor material in said wafer; and
photons of said second beam have energy lower than said bandgap energy.

13. The apparatus of claim 1 wherein:
a partially transmissive mirror located in the path of each of said first beam and said second beam, said partially transmissive mirror being positioned to reflect one of said first beam and said second beam along a path coincident with the path of the other of said first beam and said second beam thereby to create a combined beam.

14. The apparatus of claim 13 further comprising:
a beam splitter positioned in said coincident path.

15. The apparatus of claim 1 wherein:
said photosensitive element includes germanium.

16. The apparatus of claim 1 wherein said photosensitive element is hereinafter "first sensor" and said second beam is polarized, the apparatus further comprises:
a polarizing beam splitter located in the path of reflection of said second beam from said wafer to direct a reflected portion of said second beam into a first component sensed by said first sensor; and
a second sensor located in a path of said second beam prior to reflection from said wafer.

17. The apparatus of claim 16 further comprising:
an oscillator capable of oscillating at a frequency lower than 2500 Hz, the oscillator being coupled to the first source; and
a lock-in amplifier coupled to said oscillator and to each of said first sensor and said second sensor.

18. The apparatus of claim 17 wherein:
said lock-in amplifier generates a third signal indicative of a difference between a first signal from said first sensor and a second signal from said second sensor on receipt of said first signal and said second signal, said third signal being in phase with oscillations of said oscillator.

19. The apparatus of claim 1 wherein:
wavelength of said second beam is above band gap energy of a material in said wafer, and said function relates said electrical signal to power of said second beam.

20. The apparatus of claim 1 wherein:
wavelength of said second beam is below band gap energy of a material in said wafer, and said function relates said electrical signal to power of said first beam.

21. The apparatus of claim 1 wherein:
the coefficient is for a constant in said function.

22. The apparatus of claim 1 wherein:
the coefficient is for a linear term in said function.

23. The apparatus of claim 1 wherein:
the coefficient is for a quadratic term in said function.

24. The apparatus of claim 23 wherein the coefficient indicates abruptness of a junction in said wafer and the computer further comprises: a memory having encoded therein values generated from at least one test wafer having a layer of known abruptness; wherein the computer is further programmed to use the coefficient to look up abruptness based on the values in memory.

25. The apparatus of claim 23 further comprising:
an interferometer located in a path of a signal obtained by interference of at least said portion of the second beam;
wherein said photosensitive element is located within said interferometer and said computer is coupled to said photosensitive element by circuitry in said interferometer.

26. The apparatus of claim 25 wherein:
the interferometer includes a lock-in amplifier that detects amplitude and phase of a signal obtained by interference between: said portion of the second beam modulated at said frequency; and another portion of the probe beam reflected by a front surface of the wafer.

27. The apparatus of claim 25 wherein:
the interferometer is located in a path of a signal obtained by interference between a reference beam, and said portion of the second beam modulated at said frequency.

28. The apparatus of claim 27 further comprising:
a detector coupled to the photosensitive element, wherein the detector is used to measure a difference in phase between: a first interference signal obtained by interference of a reference beam and the portion of the probe beam reflected by the plurality of charge carriers; and
a second interference signal obtained by interference of the reference beam and another portion of probe beam reflected by a front surface of the wafer.

29. The apparatus of claim 23 wherein:
the interferometer is located in a path of a signal obtained by interference between a reflected portion of said second beam with an un-reflected portion of said second beam to obtain a sum component and a difference component; and the photosensitive element is located within said interferometer to determine a difference between a first magnitude of said sum component and a second magnitude of said difference component.

30. The apparatus of claim 1 wherein: the computer is programmed to normalize a value of the electrical signal.

31. The apparatus of claim 1 further comprising:

a heat treatment unit wherein the wafer is annealed;

wherein the computer is coupled to the heat treatment unit to control operation thereof based on at least said coefficient.

32. The apparatus of claim 1 further comprising:

wafer processing unit wherein a portion of the wafer is formed;

wherein the computer is coupled to the wafer processing unit to control operation thereof based on at least said coefficient.

33. The apparatus of claim 1 further comprising:

means for fabricating the wafer; wherein the computer is coupled to the fabricating means to control operation thereof based on at least said coefficient.

34. The apparatus of claim 1 wherein:

the parameter is power of said first beam; said first source being capable of adjusting power of said first beam; and said computer being programmed to control said first source to adjust power of said first beam to a plurality of levels and said computer being further programmed to capture a corresponding plurality of concentrations of said charge carriers.

* * * * *